United States Patent
Tsai et al.

(10) Patent No.: US 9,012,310 B2
(45) Date of Patent: Apr. 21, 2015

(54) EPITAXIAL FORMATION OF SOURCE AND DRAIN REGIONS

(75) Inventors: Chun Hsiung Tsai, Xinpu Township (TW); Yi-Fang Pai, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 68 days.

(21) Appl. No.: 13/493,626

(22) Filed: Jun. 11, 2012

(65) Prior Publication Data

US 2013/0328126 A1 Dec. 12, 2013

(51) Int. Cl.
| | | |
|---|---|---|
| H01L 21/00 | (2006.01) | |
| H01L 21/02 | (2006.01) | |
| H01L 21/8234 | (2006.01) | |
| H01L 29/08 | (2006.01) | |
| H01L 29/165 | (2006.01) | |
| H01L 29/417 | (2006.01) | |
| H01L 29/66 | (2006.01) | |
| H01L 29/78 | (2006.01) | |

(52) U.S. Cl.
CPC .. *H01L 21/823425* (2013.01); *H01L 21/02381* (2013.01); *H01L 21/0245* (2013.01); *H01L 21/02532* (2013.01); *H01L 21/0262* (2013.01); *H01L 21/02639* (2013.01); *H01L 29/0847* (2013.01); *H01L 29/165* (2013.01); *H01L 29/41783* (2013.01); *H01L 29/6659* (2013.01); *H01L 29/66636* (2013.01); *H01L 29/7834* (2013.01); *H01L 29/7848* (2013.01)

(58) Field of Classification Search
CPC ......... H01L 21/20; H01L 21/36; H01L 21/38; H01L 21/0228; H01L 21/02293
See application file for complete search history.

(56) References Cited

U.S. PATENT DOCUMENTS

| | | | |
|---|---|---|---|
| 6,137,149 A | 10/2000 | Kodama | |
| 6,238,989 B1 | 5/2001 | Wc et al. | |
| 7,195,983 B2 * | 3/2007 | Chindalore et al. | 438/301 |
| 7,910,445 B2 * | 3/2011 | Onoda | 438/285 |
| 8,053,273 B2 | 11/2011 | Kammler et al. | |
| 2001/0023108 A1 | 9/2001 | Miyano et al. | |
| 2005/0077570 A1 | 4/2005 | Nishinohara | |

(Continued)

OTHER PUBLICATIONS

Fischer, P. R., et al., Lowe Temperature Silcore Deposition of Undoped and Doped Silicon Films:, ECS Transactions, 3 (2) 203-215 (2006), pp. 203-215.

*Primary Examiner* — Charles Garber
*Assistant Examiner* — Evren Seven
(74) *Attorney, Agent, or Firm* — Lowe Hauptman & Ham, LLP (57) ABSTRACT

Mechanisms for forming source/drain (S/D) regions of field effect transistors (FETs) are provided. The mechanisms eliminate dislocations near gate corners and gate corner defects (GCDs), and maintain transistor performance. The mechanisms described involve using a post-deposition etch to remove residual dislocations near gate corners after a cyclic deposition and etching (CDE) process is used to fill a portion of the recess regions with an epitaxially grown silicon-containing material. The mechanisms described also minimize the growth of dislocations near gate corners during the CDE process. The remaining recess regions may be filled by another silicon-containing layer deposited by an epitaxial process without forming dislocations near gate corners. The embodiments described enable gate corners to be free of dislocation defects, preserve the device performance from degradation, and widen the process window of forming S/D regions without gate corner defects and chamber matching issues.

20 Claims, 7 Drawing Sheets

(56) References Cited

U.S. PATENT DOCUMENTS

| | | |
|---|---|---|
| 2006/0084235 A1 | 4/2006 | Barr et al. |
| 2006/0088968 A1 | 4/2006 | Shin et al. |
| 2006/0115933 A1 | 6/2006 | Ye et al. |
| 2006/0131665 A1* | 6/2006 | Murthy et al. ............... 257/384 |
| 2006/0234504 A1 | 10/2006 | Bauer et al. |
| 2006/0289902 A1 | 12/2006 | Ping et al. |
| 2007/0190730 A1* | 8/2007 | Huang et al. ................ 438/299 |
| 2007/0287272 A1 | 12/2007 | Bauer et al. |
| 2008/0246057 A1* | 10/2008 | Lin et al. ..................... 257/190 |
| 2009/0039399 A1* | 2/2009 | Sudo ............................. 257/288 |
| 2009/0075029 A1 | 3/2009 | Thomas et al. |
| 2009/0104739 A1* | 4/2009 | Ye et al. ....................... 438/197 |
| 2011/0104875 A1* | 5/2011 | Wojtczak et al. ............ 438/478 |
| 2011/0117732 A1 | 5/2011 | Bauer et al. |
| 2011/0124169 A1 | 5/2011 | Ye et al. |
| 2011/0212584 A9* | 9/2011 | Chakravarthi et al. ........ 438/197 |
| 2012/0056245 A1* | 3/2012 | Kang et al. ................... 257/192 |

* cited by examiner

EPITAXIAL FORMATION OF SOURCE AND DRAIN REGIONS

CROSS-REFERENCES TO RELATED APPLICATIONS

The present application is related to U.S. application Ser. No. 13/029,378, entitled "INTEGRATED CIRCUITS AND FABRICATION METHODS THEREOF" filed on Feb. 17, 2011, and U.S. application Ser. No. 13/114,910, entitled "Source/Drain Formation and Structure" filed on May 24, 2011, both of which are incorporated herein by reference in their entireties.

TECHNICAL FIELD

The present disclosure relates generally to the field of semiconductor devices and, more particularly, to integrated circuits and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Generally, a plurality of ion implantations have been implemented for forming source/drain (S/D) regions, lightly-doped drain (LDD) regions, and pocket regions of transistors. For example, an N-type source/drain (NSD) process has a room-temperature phosphorus ion implantation that is provided to form a gradient dopant junction profile in a substrate. A room-temperature carbon ion implantation is then performed on the S/D regions to prevent over-diffusion of phosphorus dopants into the substrate. A room-temperature arsenic ion implantation and a room-temperature phosphorus ion implantation are performed to form S/D doped regions. After the multiple ion implantations, a rapid thermal anneal (RTA) is performed to activate dopants and to cure damage resulting from the ion implantations. Silicide is then formed at the top of the S/D doped regions.

As noted, the process described above uses the room-temperature phosphorus ion implantation to form the junction profile. When the sizes of transistors are scaled down, the S/D junction profiles may be too deep. The multiple ion implantations may also substantially damage the S/D regions. To cure the damage, an annealing process with a high thermal budget, e.g., a higher rapid thermal annealing (RTA) temperature of about 1050° C. and/or a longer RTA time, may be applied. The high thermal budget may aggravate a short-channel effect (SCE) of the transistors. If an anneal with a low thermal budget is applied, implantation damage may not be desirably cured. The low thermal budget may also result in a transient-enhanced diffusion (TED).

In order to address the issues related to implanting dopants in S/D regions, a silicon film with dopants is epitaxially grown in recessed regions near the gate electrodes. However, there are challenges in using epitaxially grown silicon film(s) with dopants to form S/D regions.

It is understood that the following descriptions provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

The embodiments will be described with respect to specific embodiments in a specific context, namely a source/drain region for a complementary metal-oxide semiconductor (CMOS) transistor. The embodiments may also be applied, however, to other doped regions within a semiconductor device.

Figure 1:
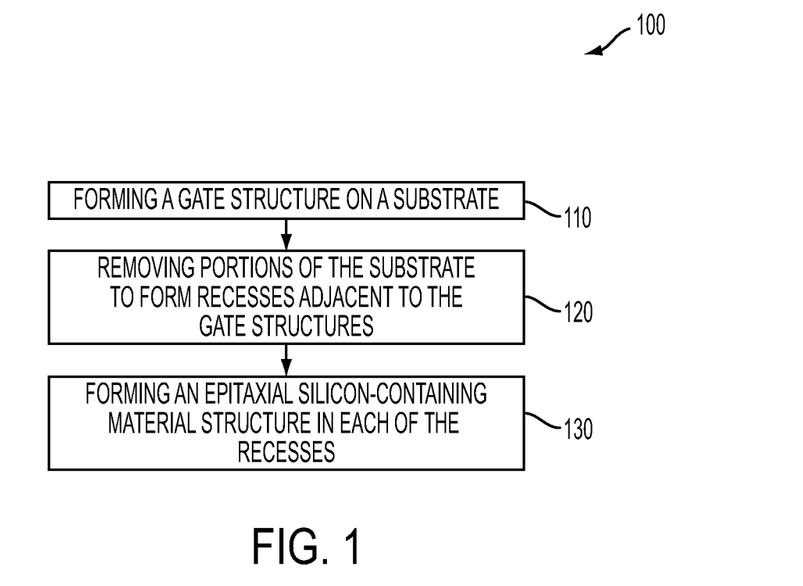
FIG. 1 is a flowchart illustrating an exemplary method of forming an integrated circuit.

Illustrated in FIG. 1 is a flowchart of a method of forming an integrated circuit, in accordance with some embodiments.

FIGS. 2A-2E are schematic cross-sectional views of an integrated circuit during various fabrication stages, in accordance with some embodiments. The integrated circuit may include various passive and active microelectronic devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, or other types of transistors. It is understood that FIGS. 2A-2E have been simplified for a better understanding of the concepts of the present disclosure. Accordingly, it should be noted that additional processes may be provided before, during, and after the method 100 of FIG. 1, and that some other processes may only be briefly described herein.

Referring now to FIG. 1, the method 100 can include forming a gate structure over a substrate (block 110). The method 100 can include removing portions of the substrate to form recesses adjacent to the gate structure (block 120). The method 100 can also include forming a silicon-containing material structure in each of the recesses (block 130).

Figure 2A:
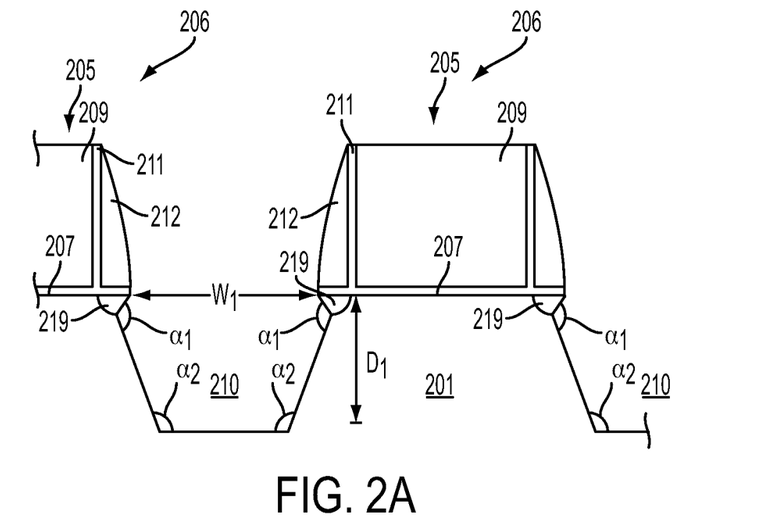
FIGS. 2A-2E are cross-sectional views of an integrated circuit during various fabrication stages, in accordance with some embodiments.

Referring now to FIGS. 2A-2E in conjunction with FIG. 1, an integrated circuit 200 can be fabricated in accordance with the method 100 of FIG. 1. In FIG. 2A, the integrated circuit 200 can have a substrate 201. Substrate 201 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Substrate 201 may include an epitaxial layer (epi layer), and may be strained for performance enhancement.

In some embodiments forming N-type transistors, the substrate 201 can be a silicon substrate doped with a P-type dopant, such as boron (resulting in a P-type substrate). A metal gate structure can have a stack structure including a high dielectric constant gate layer, a diffusion barrier layer, a metal work function layer, a metallic layer, and/or other suitable layers. A dummy gate structure can have a stack structure including a dummy material layer, a hard mask layer, and/or other suitable layers.

In some embodiments, a gate stack 205 comprising a gate dielectric 207, a gate electrode 209, first spacers 211, and second spacers 212 may be formed over the substrate 201. The gate dielectric 207 may be a dielectric material, such as silicon oxide, silicon oxynitride, silicon nitride, an oxide, a nitrogen-containing oxide, a combination thereof, or the like. The gate dielectric 207 may have a relative permittivity value greater than about 4. Other examples of such materials include aluminum oxide, lanthanum oxide, hafnium oxide, zirconium oxide, hafnium oxynitride, or combinations thereof.

The gate electrode 209 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, or the like.

Surrounding the gate stack 205 are the first spacers 211 and the second spacers 212. The gate stack 205 and the surrounding spacers, such as spacers 211 and 212, form a gate structure 206. The spacer layers may comprise SiN, oxynitride, SiC, SiON, oxide, and the like. However, as one of ordinary skill in the art will recognize, the first spacers 211 and the second spacers 212 as illustrated in FIG. 2A are intended to be merely illustrative and are not intended to limit the embodiments to these descriptions. Rather, any suitable number and combination of spacer layers and shapes may be utilized in order to form spacers for the gate stack 205, and any suitable combination of spacers may alternatively be utilized.

In some embodiments of forming an N-type transistor, N-type lightly-doped drains (LDDs) 219 can be formed in the substrate 201. Portions of the N-type LDDs 219 can be formed under the gate structure 205. The N-type LDDs 219 can be formed of n-type dopants (impurities). For example, the dopants can comprise phosphorous, arsenic, and/or other group V elements. In some embodiments, at least one thermal annealing process, e.g., a rapid thermal annealing (RTA) process, can be performed to activate the dopants of the N-type LDDs 219. In some embodiments of forming an N-type transistor, P-type pocket doped regions (not shown) can be formed in the substrate 201. The P-type pocket doped regions can be formed of P-type dopants (impurities). For example, the dopants can comprise boron and/or other group III elements.

FIG. 2A illustrates the formation of recesses 210 within the substrate 201. The recesses 210 may be formed using, e.g., a wet etch process selective to the material of the substrate 201 and uses the gate stack 205, the first spacers 211, and the second spacers 212 as a hard mask in order to form the recesses 210. For example, an etchant such as carbon tetrafluoride ($CF_4$) or tetramethylammonium hydroxide (THMA), combinations of these, or the like may be used to perform the wet etch and form the recesses 210. The recesses 210 provide an opening in the substrate 201 into which source/drain regions (whose formation is described further below with respect to FIGS. 2B-2E) will subsequently be formed.

Recess 210, formed below and between a spacer 212 surrounding gate structure 205 and a neighboring spacer 212 as shown in FIG. 2A, has a width $W_1$ of between about 20 Å and about 100 Å, in accordance with some embodiments. Recesses 210 may additionally undercut the first spacers 211 and/or the second spacers 212. Additionally, the wet etch process may be continued until the recesses 210 have a depth $D_1$ from a surface of the substrate 201. In some embodiments, $D_1$ is in a range from about 200 Å and about 400 Å. However, these dimensions are not intended to limit the present embodiments, as any suitable dimensions for the recesses 210 may alternatively be utilized.

The recesses 210 may be formed to have either an angular or rounded shape. In an embodiment in which the recesses 210 have an angular shape, the recesses 210 may be formed to have a first angle $\alpha_1$ along with top of the recesses 210 and a second angle $\alpha_2$ along the bottom of the recesses 210. In some embodiments, the first angle $\alpha_1$ is in a range from about 90° and about 180°. The second angle $\alpha_2$ is in a range from about 85° and about 170°, in accordance with some embodiments.

Figure 2B:
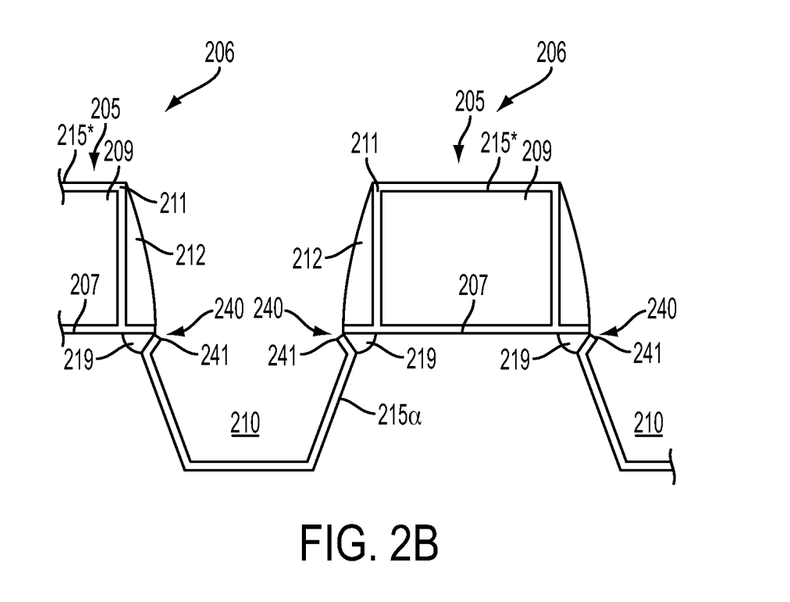
Figure 2C:
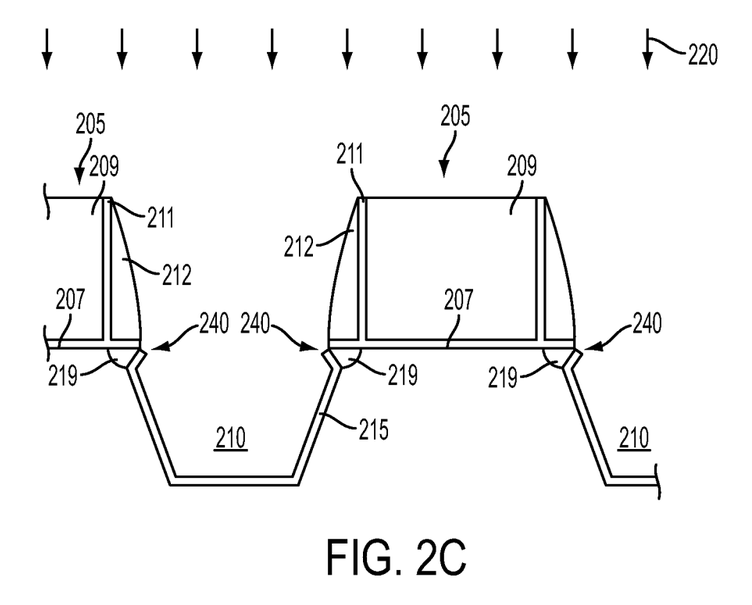
Figure 2D:
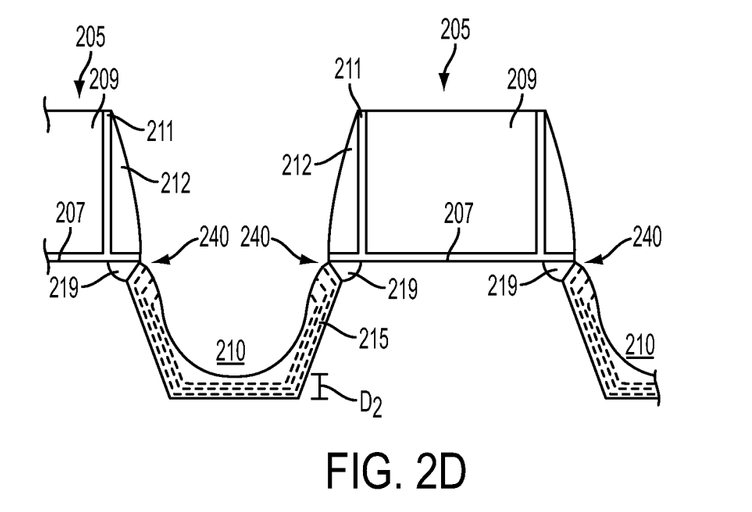
Figure 2E:
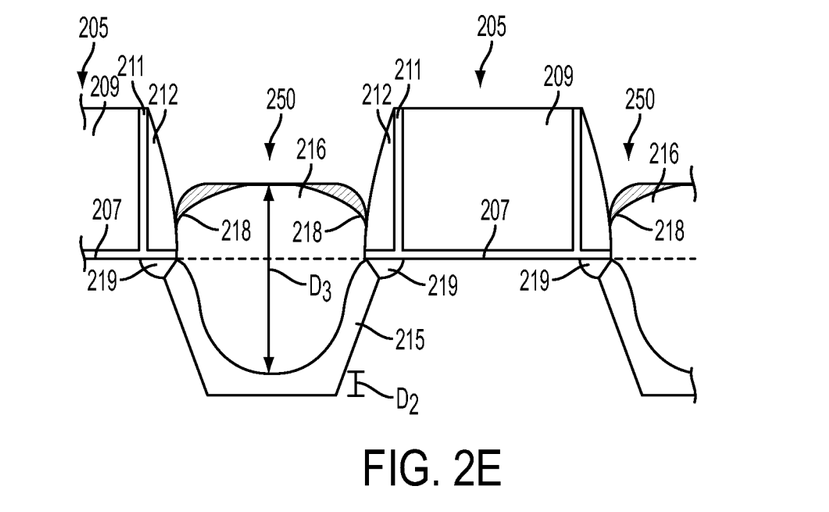

Referring to FIGS. 1 and 2B-2E, the method 100 can include forming an epitaxial silicon-containing material structure in each of the recesses (block 130). In some embodiments, the block 130 can include performing an epitaxial deposition/partial etch process and repeating the epitaxial deposition/partial etch process at least once. The block 130 may include epitaxially depositing a silicon-containing material (or layer) 215, in recesses 210 as shown in FIGS. 2B-2D, in accordance with some embodiments. Block 130 also may include depositing a silicon-containing layer 216 over the silicon-containing material 215 in recesses 210, as shown in FIG. 2E, in accordance with some embodiments.

The deposition of the silicon-containing material 215 includes in-situ doping the silicon-containing material 215, in accordance with some embodiments. For example, forming an N-type transistor can use an N-type doping precursor, e.g., phosphine ($PH_3$) and/or other N-type doping precursor. By using the in-situ doping process, the dopant profile of the silicon-containing material 215 can be desirably achieved. In some embodiments, the silicon-containing material 215 can be an N-type doped silicon layer that is doped with phosphorus (SiP). In some embodiments, the silicon-containing material 215 can be an N-type doped silicon layer that is doped with both phosphorus and carbon (SiCP). Carbon could impede the out-diffusion of phosphorus from the silicon-containing material 215. Other types of dopants may also be included. In some embodiments, the phosphorus dopant has a concentration in a range from about 0.3% to about 2% (atomic percent). In some embodiments, the carbon dopant has a concentration in a range from about 0.3% to about 2% (atomic percent).

In some embodiments, the silicon-containing material 215 can be formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. In some embodiments, the deposition of the silicon-containing material 215 can have a deposition temperature of about 750° C. or less. In other embodiments, the deposition temperature ranges from about 500° C. to about 750° C. The pressure of the deposition process can range from about 50 Torr to about 500 Torr.

The deposition of the silicon-containing material 215 can use at least one silicon-containing precursor, such as silane ($SiH_4$), disilane ($Si_2H_6$), trisilane ($Si_3H_8$), Dichlorosilane ($SiH_2Cl_2$), another silicon-containing precursor, and/or any combinations thereof. In some embodiments, the silicon-containing precursor can have a flow rate ranging from about 20 standard cubic centimeters per minute (sccm) to about 500 sccm. In other embodiments forming a P-type transistor, the silicon-containing material 215 can be made of at least one material, such as silicon, silicon germanium, other semiconductor materials, and/or any combinations thereof.

As mentioned above, the deposition of the silicon-containing material 215 includes in-situ doping the silicon-containing material 215, in accordance with some embodiments. For example, forming an N-type transistor can use an N-type doping precursor, e.g., phosphine ($PH_3$) and/or other N-type doping precursor. In some embodiments, the N-type doping precursor can have a flow rate ranging from about 20 sccm to about 500 sccm.

The silicon-containing material 215 in recesses 210 is epitaxial. However, dislocations 241 would form at gate corners 240 due to their proximity of spacers 211 or 212, which are not made of crystalline silicon. As shown in FIG. 2B, gate corners 240 are located at the edge of gate structure 206 near the interface between the spacers, such as 211 and 212, and substrate. If the dislocations 241 at gate corners 240 are not removed, they would accumulate with the epitaxial growth of silicon-containing material 215a in recesses 210 and would become gate corner defects (GCDs), which are in the path of carrier flow. The GCDs could degrade on current of transistors ($I_{on}$) and also increase the variation of threshold voltage ($V_t$). The deposition process leaves an amorphous silicon-containing material 215* on non-silicon surfaces, such as over gate electrode 209, in some embodiments.

Referring to FIG. 2C, an etching (or partial etching) process 220 removes the amorphous silicon-containing material 215* and also a portion of the silicon-containing material 215a in recesses 210. The remaining silicon-containing material 215 can be formed in each of the recesses 210. In some embodiments, the etching process 220 can use an etching gas including at least one of hydrogen chloride (HCl), chlorine ($Cl_2$), germanium hydride ($GeH_4$), other suitable etching gases, and/or any combinations thereof. The flow rate of the etching gas can range from about 50 sccm to about 700 sccm, in accordance with some embodiments. In some embodiments, the pressure of the etching process 220 ranges from about 50 Torr to about 500 Torr. In some embodiments, the etching process 220 can have an etching temperature of about 750° C. or less. In other embodiments, the etching temperature can range from about 500° C. to about 750° C.

The etching process 220 would remove the amorphous silicon-containing material 215* over non-crystalline surface at a rate higher than the removal rate of epitaxial silicon-containing material 215. In addition, the etching process would remove a portion of epitaxial silicon-containing material 215 including the dislocations 241 near the gate corners 240. As mentioned above, the dislocations 241 need to be removed as completely as possible. Otherwise, dislocations 241 would accumulate and grow with the epitaxial deposition of films, such as film 215, in recesses 210 and would become GCDs.

The epitaxial deposition/partial etch process is repeated a number of times until a desired thickness $D_2$ is reached, as shown in FIG. 2D in accordance with some embodiments. Such repeated deposition/partial etch process is also called a cyclic deposition/etch (CDE) process. In some embodiments, $D_2$ is in a range from about 70 Å and about 300 Å. The dotted lines in recesses 210 are used to illustrate the multiple sublayers formed by the epitaxial CDE process. With proper tuning of the partial etch process, the silicon-containing layer 215 near gate corners 240 would not have dislocations.

As mentioned above, the silicon-containing material 215 can be an N-type doped silicon layer that is doped with both phosphorus and carbon, in accordance with some embodiments. Carbon could impede the out-diffusion of phosphorus from the silicon-containing material 215. The phosphorus- and carbon-doped silicon layer can be referred to as an SiCP layer. The dopants in the silicon-containing material 215 deposited by CDE have higher level of activation than implanted dopants. In some embodiments, the dopant activation level is in a range from about 2E20 atoms/cm$^3$ to about 6E20 atoms/cm$^3$. In contrast, the activation of implanted dopant at S/D is typically at about 1E20 to 2E20 atoms/cm$^3$ level. The higher activation level makes formation of in-situ doping of epitaxial grown silicon-containing desirable.

Following the CDE process, a selective epitaxial growth (SEG) process may be used to deposit additional silicon-containing film to fill the remaining recesses 210. The SEG process has a higher growth rate than the CDE process, in accordance with some embodiments. The SEG process is a selective deposition process and the silicon-containing film formed by this process deposits on epitaxial silicon-containing film, such as layer 215. SEG processes utilize simultaneous deposition and etch. The silicon-containing layer 216 deposited by SEG may be formed beyond the silicon substrate surface 230, as shown in FIG. 2E in accordance with some embodiments. In some embodiments, the surface 216 of the silicon-containing layer 216 is leveled with silicon substrate surface 230. The thickness $D_3$ of the silicon-containing layer 216 is in a range from about 30 Å to about 400 Å, in some embodiments. In some embodiments, the silicon-containing layer is doped with phosphorus (SiP).

When the epitaxially grown silicon-containing layer 216 is formed next to spacers 212, dislocations 218 would be formed and accumulate, as shown in FIG. 2E. However, since dislocations 218 are not in the paths of carriers, they do not degrade device performance. Layer 215 and layer 216 form the S/D regions 250. In some embodiments, the material and/or method of forming the silicon-containing layer 216 can be as same as or similar to those of the silicon-containing material 215. In some embodiments, the silicon-containing layer 216 may have a dopant concentration different from that of the silicon-containing material 215.

Figure 3:
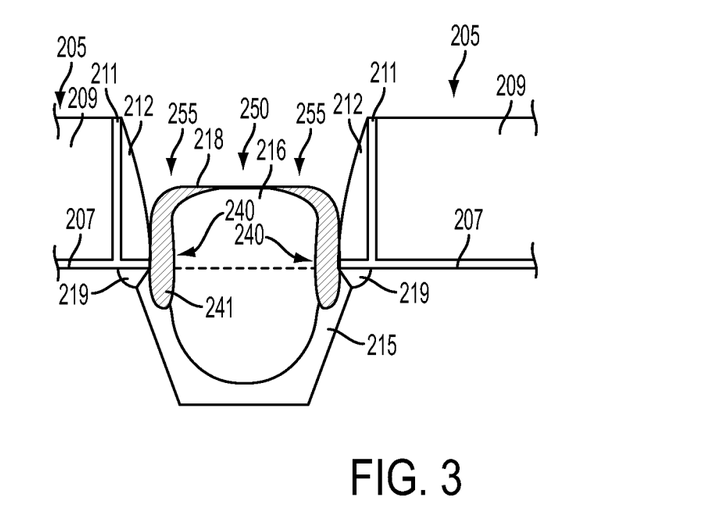
FIG. 3 is a cross-sectional view of dislocations in a source/drain region near a gate stack, in accordance with some embodiments.

If dislocations 241 near gate corners 240 are allowed to remain on some regions of wafers, as shown in FIG. 3 in accordance with some embodiments, the dislocations 241 near gate corners 240 in layer 215 could initiate the growth of dislocations 218 in layer 216 to form continuous dislocation regions 255. The dislocations in continuous regions 255 that are in carrier paths would degrade device performance. Therefore, there is a need to improve the process of forming the S/D regions 250 to remove dislocations 241 on all parts of wafers. As mentioned above, the dislocations 241 at gate corners 240 start with the formation of the silicon-containing material 215 in recess 210. Dislocations 241 would accumulate and grow with the epitaxial deposition of the silicon-containing material 215.

To ensure dislocations 241 of material 215 do not grow to merge with dislocations 218 in layer 216 to form continuous dislocation regions 255, the thickness $D_2$ of silicon-containing material 215 should be kept relatively low to keep the growth of dislocations 241 to a minimum. However, since the carbon in the silicon-containing material 215 (SiCP) could impede the out diffusion of phosphorus (P), $D_2$ cannot be too thin either. As mentioned above in FIG. 2D, $D_2$ is in a range from about 70 Å and about 300 Å, in accordance with some embodiments. In addition to controlling the thickness $D_2$ of the silicon-containing material 215 to limit the growth of dislocations 241, the growth of dislocations 241 can also be controlled by the CDE process.

Figure 4A:
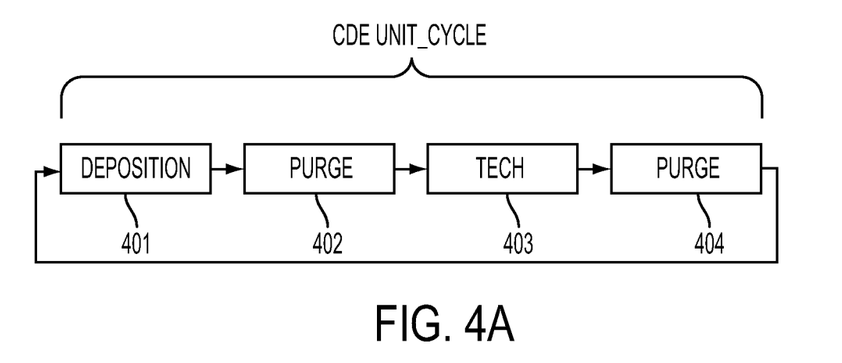
FIG. 4A is a process sequence of a CDE process in a process chamber, in accordance with some embodiments.

FIG. 4A shows the process sequence of a CDE process 400 in a process chamber, in accordance with some embodiments. The process 400 include a deposition operation 401, a post-deposition purge operation 402, a partial-etch operation 403, and a post-etch purge operation 404, in accordance with some embodiments. The CDE process occurs in a process chamber. In some embodiments, the deposition operation 401 employs a silicon-containing gas, such astrisilane ($Si_3H_8$), di-silane ($Si_2H_6$), etc., as silicon source. A dopant gas, such as $PH_3$, is also used to provide a dopant, in accordance with some embodiments. In some embodiments, the deposition time is in a range from about 3 seconds to about 20 seconds. In some embodiments, the amount of the silicon-containing material 215 deposited in operation 401 is in a range from about 15 Å to about 80 Å during each CDE cycle, in accordance with some embodiments.

After deposition operation 401, a purge gas is introduced into the process chamber to purge out the deposition gas at operation 402. The purge gas may be any non-reactive gas with the deposition gas, such as $N_2$, or any inert gas ($H_2$, Ne, Ar, Kr, etc.) In some embodiments, an absorbing gas, such as HCl, is used to remove any residual deposition gas(es) in the process chamber during operation 402. Once the chamber is cleaned, the etch operation 403 follows. In some embodiments, the etch operation 403 employs HCl gas and $GeH_4$ gas. HCl and $GeH_4$ react with silicon to etch silicon. For example, $GeH_4$ reacts with silicon to form SiGe, which is then removed by HCl. In some embodiments, the etch time is in a range from about 40 seconds to about 200 seconds. In some embodiments, the amount of the silicon-containing material 215 removed in operation 403 is in a range from about 5 Å and about 30 Å during each CDE cycle, in accordance with some embodiments.

After the etching operation 403, the purge operation 404 follows to remove the etching gases used in operation 403 from the chamber. The purge gas may be any non-reactive gas with the deposition gas, such as $N_2$, or any inert gas ($H_2$, Ne, Ar, Kr, etc.). As mentioned above, an absorbing gas, such as HCl, is used to remove any residual deposition gas(es) in the process chamber during operation 402, in some embodiments. In each individual deposition/partial-etch cycle, a net thickness in a range from about 10 Å and about 40 Å is formed in an individual cycle in accordance with some embodiments. CDE process 400 is repeated a number of times until the desired thickness $D_2$ is reached.

As described above, the CDE process 400 requires switching gases in the processing chamber. During manufacturing of semiconductor devices, multiple chambers of processing systems are used to process substrates. Chamber matching could become an issue, especially for a process operation with a short operation period, such as the deposition operation 401. For example, if operation 401 has a processing time of 10 seconds, a gas flow switching with a delay of about 1 second could cause a 10% process variation. Such variation could result in thicker deposition on some wafers or portions of wafers. As a result, some dislocations 241 are not completely removed in the etching operation 403 due to gas flow switching delay in some chambers.

Figure 4B:
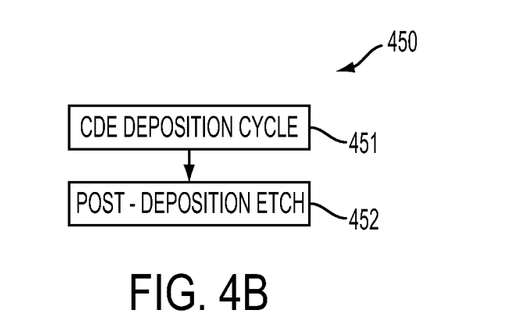
FIG. 4B is a process flow of depositing a silicon-containing material in recesses of a substrate, in accordance with some embodiments.

In order to prevent such occurrence, a post-CDE etch can be added. FIG. 4B shows a process flow 450 of depositing the silicon-containing material 215 in recesses 210, in accordance with some embodiments. At operation 451 of process flow 450, a CDE process is performed to deposit silicon-containing material (or layer) 215 recesses 210. The CDE process deposits a thickness $D_2$ of material 215, in accordance with some embodiments. The CDE process includes a number of deposition/partial-etch cycles. After thickness $D_2$ is reached, a post-deposition etch process is performed at operation 452 to remove residual dislocations 241 accumulated near gate corners 240. The post-deposition etch at operation 452 also utilizes HCl and $GeH_4$, which are also used in the etch operation 403 of CDE, in accordance with some embodiments. However, the process parameter(s) may be similar to or different from operation 403 of CDE. The $HCl/GeH_4$ flow ratio for etch operation 452 is significantly higher than the $HCl/GeH_4$ flow ratio of etch operation 403, in accordance with some embodiments. However, using an $HCl/GeH_4$ flow ratio similar to etch operation 403 may also remove residual dislocations 241.

In some embodiments, the process duration is in a range from about 30 seconds to about 80 seconds. The extended etch removes dislocations 241 in substrate processes in different chambers to ensure a chamber mismatch does not result in the growth of dislocations 241, which could lead to GCDs.

Figure 5A:
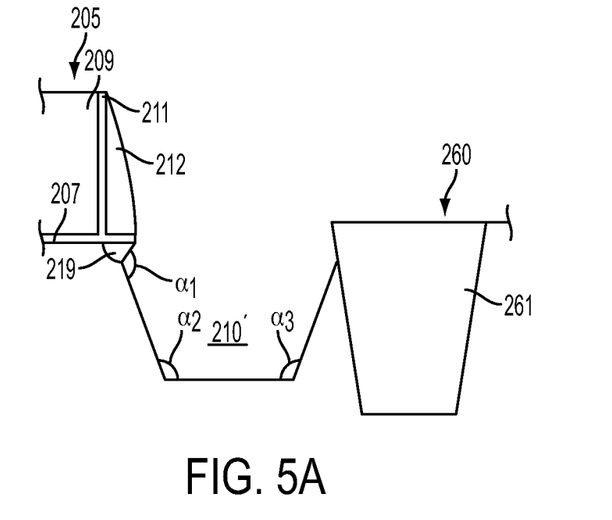
FIGS. 5A-5C are cross-sectional views of a process sequence of forming a S/D region between a gate stack and an isolation structure, in accordance with some embodiments.
Figure 5B:
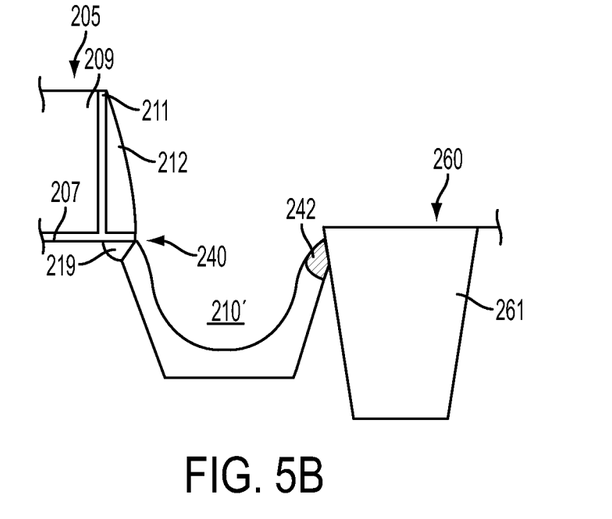
Figure 5C:
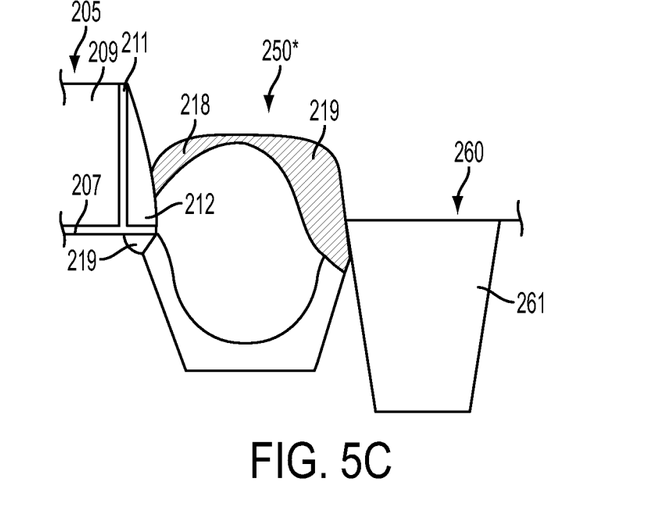

With the additional post-deposition etch as described in operation 452 above, the S/D regions 250 are formed free of GCDs for wafers processed by various chambers, as shown in FIG. 2E in accordance with some embodiments. Transistors next to isolation devices usually experience more challenges associated with dislocations due to the neighboring isolation structure. FIGS. 5A-5C are cross-sectional views of a process sequence of forming a S/D region between a gate stack and an isolation structure, in accordance with some embodiments. FIG. 5A shows one of the gate stacks 205 with spacers 211 and 212 next to a shallow trench isolation (STI) 260, in accordance with some embodiments. The STI 260 is filled with one or more dielectric materials, such as dielectric layer 261. In some embodiments, dielectric layer 261 is made of $SiO_2$. A recess 210* is formed between the gate stack 205 and the STI 260. In an embodiment in which the recess 210* has an angular shape, the recess 210* may be formed to have a first angle $\alpha_1$ along with top of the recess 210* and a second angle $\alpha_2$ along the bottom of the recess 210* next to the gate stack 205, as shown in FIG. 5A. In some embodiments, the first angle $\alpha_1$ is in a range from about 90° to about 180°. The second angle $\alpha_2$ is in a range from about 85° to about 170°, in accordance with some embodiments. The recess 210* also forms a third angle $\alpha_3$ along the bottom of recess 210* next to STI 260. The third angle $\alpha_3$ is in a range from about 85° to about 170°, in accordance with some embodiments.

FIG. 5B shows the structure of FIG. 5A after a CDE process 451 and the post-deposition etching 452 described in FIGS. 4A and 4B have been performed to form the silicon-containing material 215* in recess 210*, in accordance with some embodiments. FIG. 5B shows that after processes 451 and 452, the silicon-containing material 215* does not have dislocations 241 on gate corner 240. However, due to being next to dielectric layer 261, dislocations 242 remains near the interface between the silicon-containing material 215* and STI 260. The number of dislocations 242 needs to be controlled so that their existence would not degrade device performance involving gate stack 205 next to STI 260. FIG. 5C shows the S/D region 250* after a silicon-containing layer 216* by the SEG process is formed over silicon-containing material 215*, in accordance with some embodiments. There are dislocations 218 in layer 216* and dislocations 229 in layer 216* near STI 260. However, the dislocations 229 and 242 are far away from the S/D region 250* near gate stack 205, which is free of dislocations. Thus, dislocations 229 and 242 do not impact the device performance of the transistor involving gate stack 205.

As noted, the processes of the method 100 described above in conjunction with FIGS. 1, 2A-2E, and 4A-4B are merely exemplary. The method 100 can include different steps according to different process flows. For example, the gate structure 205 can be formed by a gate-first process or a gate-last process. In some embodiments using a gate-last process, the method 100 can include a gate replacing process. The gate structure 205 can be a dummy gate structure. The dummy gate structure 205 can each include a dummy gate material and a hard mask material formed thereover. The dummy gate material can be made of at least one material such as polysilicon, amorphous silicon, silicon oxide, silicon nitride, a material having an etching rate that is substantially different from the spacers (shown in FIG. 2A).

For the gate-last process, the hard mask materials and the dummy gate materials can be removed, for example, by a wet etch process, a dry etch process, or any combinations thereof. After removing the dummy gate materials, the method 100 can include forming gate electrode material within openings in which the dummy gate materials are disposed. In some embodiments, the gate electrode material can be a stack structure including a diffusion barrier layer, a metallic work function layer, a metallic conductive layer, and/or other suitable material layers.

In some embodiments, at least one high dielectric constant (high-k) layer (not shown) can be formed under the gate electrode material. The high-k dielectric layer can include high-k dielectric materials such as $HfO_2$, HfSiO, HfSiON, HfTaO, HfSiO, HfZrO, other suitable high-k dielectric materials, or any combinations thereof. In some embodiments, the high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, or any combinations thereof.

In some embodiments, the diffusion barrier can be configured to prevent metallic ions of the work function metal material from diffusing into the gate dielectric material. The diffusion barrier may comprise at least one material such as aluminum oxide, aluminum, aluminum nitride, titanium, titanium nitride, tantalum, tantalum nitride, other suitable material, and/or combinations thereof.

In some embodiments, the metallic work function layer can include at least one P-metal work function layer and/or at least one N-metal work function layer. The P-type work function materials can include compositions such as ruthenium, palladium, platinum, cobalt, nickel, and conductive metal oxides, and/or other suitable materials. The N-type metal materials can include compositions such as hafnium, zirconium, titanium, tantalum, aluminum, metal carbides (e.g., hafnium carbide, zirconium carbide, titanium carbide, aluminum carbide), aluminides, and/or other suitable materials. In some embodiments, the metallic conductive layer can be made of at least one material, such as aluminum, copper, Ti, TiN, TaN, Ta, TaC, TaSiN, W, WN, MoN, MoON, $RuO_2$, and/or other suitable materials.

In some embodiments, dielectric materials, contact plugs, via plugs, metallic regions, and/or metallic lines (not shown) can be formed over the gate electrode portions for interconnection. The dielectric layers may include materials such as silicon oxide, silicon nitride, silicon oxynitride, low-k dielectric material, ultra low-k dielectric material, or any combinations thereof. The via plugs, metallic regions, and/or metallic lines can include materials such as tungsten, aluminum, copper, titanium, tantalum, titanium nitride, tantalum nitride, nickel silicide, cobalt silicide, other conductive materials, and/or combinations thereof. The via plugs, metallic regions, and/or metallic lines can be formed by any suitable processes, such as deposition, photolithography, and etching processes, and/or combinations thereof.

The embodiments of mechanisms for forming source/drain (S/D) regions of field effect transistors (FETs) described eliminate dislocations near gate corners and gate corner defects (GCDs), and maintain transistor performance. The mechanisms described involve using a post-deposition etch to remove residual dislocations near gate corners after a cyclic deposition and etching (CDE) process is used to fill a portion of the recess regions with an epitaxially grown silicon-containing material. The mechanisms described also involve keeping the thickness of the portion of recess regions filled by the CDE process in a low range to minimize the growth of dislocations near gate corners. The remaining recess regions may be filled by another silicon-containing layer deposited by an epitaxial process without dislocations near gate corners. The embodiments described enable gate corners to be free of dislocation defects and prevent device performance degradation. The mechanisms described also widen the process window of forming S/D regions without gate corner defects and reduce chamber matching issues.

In a first exemplary embodiment, a method of forming an integrated circuit is provided. The method includes forming a plurality of gate structures over a substrate, and removing portions of the substrate to form recesses adjacent to the plurality of gate structures. The method also includes depositing a first epitaxial silicon-containing layer in the recesses, and depositing the first epitaxial silicon-containing layer using a cyclic deposition etching (CDE) process. The method further includes performing an etching process after depositing the first epitaxial silicon-containing layer to remove dislocations near gate corners. In addition, the method includes depositing a second epitaxial silicon-containing layer over the first epitaxial silicon-containing layer to form source and drain regions next to the plurality of gate structures.

In a second exemplary embodiment, a method of forming an integrated circuit is provided. The method includes forming a plurality of gate structures over a substrate, and removing portions of the substrate to form recesses adjacent to the plurality of gate structures. The method also includes depositing a first epitaxial silicon-containing layer in the recesses, and depositing the first epitaxial silicon-containing layer using a cyclic deposition etching (CDE) process. The method further includes performing an etching process after depositing the first epitaxial silicon-containing layer to remove dislocations near gate corners. In addition, the method includes depositing a second epitaxial silicon-containing layer over the first epitaxial silicon-containing layer to form source and drain regions next to the plurality of gate structures. The etching process after depositing the first epitaxial silicon-containing layer enables the source and drain regions formed to be free of dislocation defects near gate corners of the plurality of gate structures.

In a third exemplary embodiment, an integrated circuit is provided. The integrated circuit includes a gate structure disposed over a substrate, and a silicon-containing material structure disposed over a recess adjacent to the gate structure. The silicon-containing material structure includes a first epitaxial layer and a second epitaxial layer, and a gate corner of the gate structure is free of dislocation. A corner of the second epitaxial layer away from a surface of the substrate and next to a spacer of the gate structure includes dislocations, and the dislocations are away from the gate corner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
   forming a plurality of gate structures over a substrate;
   removing portions of the substrate to form recesses adjacent to the plurality of gate structures;
   depositing a first epitaxial silicon-containing layer in the recesses, wherein depositing the first epitaxial silicon-containing layer uses a cyclic deposition etching (CDE) process, and a top surface of the first epitaxial silicon-containing layer is entirely below a top surface of the substrate;
   performing an etching process after depositing the first epitaxial silicon-containing layer to remove dislocations near gate corners, wherein an entirety of sidewalls of each recess of the recesses remains covered by the first epitaxial silicon-containing layer following the etching process; and
   depositing a second epitaxial silicon-containing layer over the first epitaxial silicon-containing layer to form source and drain regions next to the plurality of gate structures, wherein a top surface of the second epitaxial silicon-containing layer is entirely above the top surface of the substrate.

2. The method of claim 1, wherein the etching process after depositing the first epitaxial silicon-containing layer enables the source and drain regions formed to be free of dislocation defects near gate corners of the plurality of gate structures.

3. The method of claim 1, wherein the etching process after depositing the first epitaxial silicon-containing layer broadens the process window to allow chamber to chamber matching for producing the first epitaxial silicon containing layer free of dislocation near gate corners.

4. The method of claim 1, wherein the processing gases of the etching process after depositing the first epitaxial silicon-containing layer include HCl and $GeH_4$.

5. The method of claim 1, wherein the recesses have a depth in a range from about 200 Å to about 400 Å.

6. The method of claim 1, wherein a thickness of the first epitaxial silicon-containing layer is in a range from about 70 Å to about 300 Å.

7. The method of claim 1, wherein a thickness of the second epitaxial silicon-containing layer is in a range from about 30 Å to about 400 Å.

8. The method of claim 1, wherein the CDE process includes a deposition, a purge after deposition, an etch, and a purge after etch in each deposition and etch cycle, and wherein the CDE process is performed in the same process chamber.

9. The method of claim 8, wherein the deposition forms an epitaxial material in each of the recesses and an amorphous material on other parts of the substrate.

10. The method of claim 8, wherein the etch in the CDE process removes a portion of silicon-containing material formed by the deposition.

11. The method of claim 1, wherein the first epitaxial silicon-containing layer is doped with phosphorus and carbon, wherein the concentration of the carbon is in a range from about 0.3 atomic % to about 2 atomic %, and wherein the concentration of the phosphorus is in a range from about 0.3 atomic % to about 2 atomic %.

12. The method of claim 1, wherein the second epitaxial silicon-containing layer is doped with phosphorus, wherein the concentration of the phosphorus is in a range from about 0.3 atomic % to about 2 atomic %.

13. The method of claim 1, wherein the processing temperatures of depositing the first epitaxial silicon-containing layer and of depositing the second epitaxial silicon-containing layer are in a range from about 500° C. to about 750° C.

14. The method of claim 1, wherein the first epitaxial silicon-containing layer and the second epitaxial silicon-containing layer are each doped with an N-type dopant, wherein the N-type dopant in each layer is doped in-situ with a dopant-containing carrier gas.

15. The method of claim 14, wherein the activation level of the first epitaxial silicon-containing layer is in range from about 2E20 atoms/$cm^3$ to about 6E20 atoms/$cm^3$.

16. A method of forming an integrated circuit, the method comprising:
   forming a plurality of gate structures over a substrate;
   removing portions of the substrate to form recesses adjacent to the plurality of gate structures;

depositing a first epitaxial silicon-containing layer in the recesses, wherein depositing the first epitaxial silicon-containing layer uses a cyclic deposition etching (CDE) process;

performing an etching process after depositing the first epitaxial silicon-containing layer to remove dislocations near gate corners; and depositing a second epitaxial silicon-containing layer over the first epitaxial silicon-containing layer to form source and drain regions next to the plurality of gate structures, wherein a deposition rate of depositing the second epitaxial silicon-containing layer is different from a deposition rate of depositing the first epitaxial silicon-containing layer, and the etching process after depositing the first epitaxial silicon-containing layer enables the source and drain regions formed to be free of dislocation defects near gate corners of the plurality of gate structures.

17. A method of forming an integrated circuit, the integrated circuit comprising a first gate structure over a substrate, the method comprising:

forming recesses in the substrate adjacent to the first gate structure;

depositing a first epitaxial silicon-containing layer in the recesses using a cyclic deposition etching (CDE) process, wherein the CDE process comprises:

depositing a silicon-containing material having a first thickness, removing a second thickness of the silicon-containing material, and repeating the depositing the silicon-containing material and the removing the second thickness of the silicon-containing material until an overall thickness is achieved; and depositing a second epitaxial silicon-containing layer over the first epitaxial silicon-containing layer to form source and drain regions next to the first gate structure, wherein the second epitaxial silicon-containing layer comprises a dislocation region containing at least one dislocation.

18. The method of claim 17, wherein depositing the first epitaxial silicon-containing layer comprises performing the CDE process in-situ.

19. The method of claim 17, wherein depositing the silicon-containing material comprises depositing the silicon-containing material to the first thickness ranging from about 15 Angstrom (Å) to about 80 Å.

20. The method of claim 17, wherein removing the second thickness of the silicon-containing material comprises removing the first thickness ranging from about 5 Å to about 30 Å.

* * * * *